US006592674B2

United States Patent

Sakai et al.

(10) Patent No.: US 6,592,674 B2
(45) Date of Patent: Jul. 15, 2003

(54) CHEMICAL VAPOR DEPOSITION APPARATUS AND CHEMICAL VAPOR DEPOSITION METHOD

(75) Inventors: Shiro Sakai, Tokushima (JP); Yukichi Takamatsu, Kanagawa (JP); Yuji Mori, Kanagawa (JP); Hiroyuki Naoi, Tokushima (JP); Hong Xing Wang, Tokushima (JP); Yoshiyasu Ishihama, Kanagawa (JP); Yutaka Amijima, Kanagawa (JP)

(73) Assignees: Japan Pionics Co., Ltd., Tokyo (JP); Tokushima Sanso Co., Ltd., Tokushima (JP)

( * ) Notice: Subject to any disclaimer, the term of this patent is extended or adjusted under 35 U.S.C. 154(b) by 0 days.

(21) Appl. No.: 09/962,143

(22) Filed: Sep. 26, 2001

(65) Prior Publication Data

US 2002/0042191 A1 Apr. 11, 2002

(30) Foreign Application Priority Data

Oct. 2, 2000 (JP) ......................... 2000-301644

(51) Int. Cl.[7] .............................................. C23C 16/00
(52) U.S. Cl. ..................................... 118/715; 118/725
(58) Field of Search .................................. 118/715, 725

(56) References Cited

U.S. PATENT DOCUMENTS

| 4,518,455 A | | 5/1985 | Muething ................... 156/613 |
| 4,800,105 A | * | 1/1989 | Nakayama et al. ........... 427/253 |
| 4,849,260 A | * | 7/1989 | Kusumoto et al. ........... 427/250 |
| 4,924,807 A | * | 5/1990 | Nakayama et al. ........... 118/725 |
| 4,994,301 A | * | 2/1991 | Kusumoto et al. ........... 427/586 |
| 5,244,501 A | * | 9/1993 | Nakayama et al. ........... 118/725 |
| 5,334,277 A | * | 8/1994 | Nakamura ................... 117/102 |
| 5,851,589 A | * | 12/1998 | Nakayama et al. ......... 427/248.1 |
| 6,113,700 A | | 9/2000 | Choi ........................... 118/715 |
| 2002/0042191 A1 | * | 4/2002 | Sakai et al. .................. 438/479 |
| 2002/0160112 A1 | * | 10/2002 | Sakai et al. ............. 427/255.28 |

FOREIGN PATENT DOCUMENTS

| EP | 0 254 651 | | 1/1988 |
| EP | 0 482 648 | | 4/1992 |
| EP | 1 193 331 A2 | * | 3/2000 |
| JP | 60-130126 | * | 7/1985 |

* cited by examiner

*Primary Examiner*—Jeffrie R. Lund
(74) *Attorney, Agent, or Firm*—Oblon, Spivak, McClelland, Maier & Neustadt, P.C.

(57) ABSTRACT

There are disclosed an apparatus and a method for chemical vapor deposition for a semiconductor film and the like, wherein a feed gas is supplied in a horizontal tubular reactor in the direction parallel to a substrate; a forcing gas is supplied therein in the direction perpendicular to the substrate; and the flow rate per unit area of the forcing gas which is supplied from a forcing gas introduction portion into the reactor is made lower in the central portion of the forcing gas introduction portion than in the peripheral portion thereof, or lower in the middle of a feed gas passageway than at both the end portions of the passageway. It is made possible by the apparatus and method to assure high quality crystals without generating a deposit of decomposed products or reaction products on a tubular reactor wall in opposition to the substrate even in the case of carrying out chemical vapor deposition of a large-sized substrate or simultaneously conducting that of a plurality of substrates, or performing the same at a high temperature.

12 Claims, 5 Drawing Sheets

CHEMICAL VAPOR DEPOSITION APPARATUS AND CHEMICAL VAPOR DEPOSITION METHOD

BACKGROUND OF THE INVENTION

1. Field of the Invention

The present invention relates to a chemical vapor deposition apparatus and a chemical vapor deposition method. More particularly, it is concerned with a chemical vapor deposition apparatus wherein a feed gas is introduced at a gas introduction portion of a horizontal tubular reactor which is arranged such that the direction of the feed gas to be fed in the horizontal tubular reactor is made substantially parallel to a substrate, so that semiconductor films are subjected to uniform chemical vapor deposition on a heated substrate; and a chemical vapor deposition method by the use of the above-mentioned apparatus.

2. Description of the Related Arts

There has been a rapid increase in recent years, in demands for a gallium nitride compound semiconductor to be used as a device for a light emitting diode, laser diode, and the like concentratedly in the field of optical communication. There is known, for instance, as a process for manufacturing a gallium nitride compound semiconductor, a process in which a semiconductor film of a gallium nitride compound is subjected to chemical vapor deposition on a substrate of sapphire or the like which has been set in advance in a tubular reactor so as to form an objective film by using, as a group III metal source, an organometallic gas such as trimethylgallium, trimethylindium and trimethylaluminum and by using ammonia as a nitrogen source.

In addition, there is available, as an apparatus for manufacturing the above-mentioned gallium nitride compound semiconductor, a chemical vapor deposition apparatus comprising a horizontal tubular reactor equipped with a susceptor for mounting a substrate thereon, a heater for heating the substrate, a feed gas introduction portion arranged such that the direction of the feed gas fed in a tubular reactor is made parallel to the substrate, and a reaction gas exhaust portion. The chemical vapor deposition apparatus comprising the horizontal tubular reactor is of such constitution that the substrate is placed on the susceptor in the tubular reactor, the substrate is heated, and thereafter a gas containing a feed gas is supplied in the reactor in the direction parallel to the substrate so that a semiconductor film is subjected to chemical vapor deposition to form a film on the substrate.

However, in such a horizontal tubular reactor, since the tubular reactor wall in opposition to the substrate is heated to a high temperature, there are caused such problems that the feed gas undergoes thermal decomposing reaction in the vicinity thereof, decomposed products or reaction products are deposited on the tubular reactor wall, and the deposited solid is dropped on the substrate, thereby markedly deteriorating the quality of the crystal. Accordingly, it is necessary to clean the inside of the tubular reactor at every time of chemical vapor deposition being performed. Consequently, the above-mentioned chemical vapor deposition apparatus comprising a horizontal tubular reactor has usually suffered from poor productivity.

In order to solve such problems, there have recently been developed an improved apparatus and method for chemical vapor deposition wherein a forcing gas introduction portion is placed on the tubular reactor wall in opposition to the substrate, a forcing gas not affecting the reaction of a carrier gas, etc. is supplied inside the tubular reactor in the direction perpendicular to the substrate so as to prevent thermal decomposing reaction of the feed gas from occurring in the vicinity of the tubular reactor wall in opposition to the substrate. It is said that the improved apparatus and method make it possible to prevent decomposed products or reaction products from being deposited on the tubular reactor wall without exerting adverse influence on the chemical vapor deposition of the semiconductor film on the substrate by properly and optionally controlling the flow rate of the forcing gas in accordance with the kind and flow rate of the feed gas, temperature of the heated substrate and the like.

Nevertheless, with regard to the above-mentioned method and apparatus which prevent decomposed products or reaction products from being deposited by supplying a forcing gas from the tubular reactor wall in opposition to the substrate, gas streams which cross at right angles, that is, a gas containing the feed gas and the forcing gas are mixed with each other on the substrate, and thus are more prone to be disordered, whereby the streams are often difficult to control. For instance, in the case of carrying out chemical vapor deposition of a large-size substrate or simultaneously conducting that of a plurality of substrates, it is difficult to supply a feed gas in a uniform concentration over a wide range of the substrate. Moreover, in the case of carrying out chemical vapor deposition by using the foregoing trimethylgallium, trimethylindium or trimethylaluminum as a feed gas, the necessity for a high temperature of 1000° C. or higher as the substrate heating temperature leads to formation of an intricate gas streams on the substrate, therefore it is difficult to control such gas stream.

In general, a relatively small amount of a forcing gas based on a gas containing a feed gas makes it impossible to prevent decomposed products or reaction products from being deposited, whereas a relatively large amount of a forcing gas based thereon exerts a negative influence upon the chemical vapor deposition of semiconductor films on the substrate.

SUMMARY OF THE INVENTION

Under such circumstances, an object of the invention is to provide a method and an apparatus for chemical vapor deposition that are capable of assuring high quality crystals in the use of a horizontal tubular reactor without generating a deposit of decomposed products or reaction products on tubular reactor walls in opposition to a substrate even in the case of carrying out chemical vapor deposition of a large-sized substrate or simultaneously conducting that of a plurality of substrates, or performing the same at a high temperature.

Other objects of the invention will become obvious from the text of this specification hereinafter disclosed. In such circumstances, intensive research and development were accumulated by the present inventors in order to solve the above-described problems involved in the prior arts. As a result, it has been found that in regard to chemical vapor deposition by using a horizontal tubular reactor which supplies a gas containing a feed gas in the direction parallel to a substrate and supplies a forcing gas in the direction perpendicular to the substrate, gas flow control is facilitated, whereby a deposit of decomposed products or reaction products on tubular reactor walls can be prevented, without exerting evil influence upon the chemical vapor deposition of semiconductor films on the substrate, by a method in which the flow rate of the forcing gas in the central portion of a forcing gas introduction portion is made lower than in the peripheral portion of the forcing gas introduction portion, or an alternative method in which the flow rate of the forcing gas in the middle of a feed gas passageway is made lower than at both the end portions of the above-mentioned passageway, even in the case of carrying out chemical vapor deposition of a large-sized substrate or simultaneously conducting that of a plurality of substrates, or performing the same at a high temperature. Thus, the present invention has been accomplished by the foregoing findings and information.

That is to say, the present invention relates to a chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate, a reaction gas exhaust portion, and a forcing gas introduction portion on a tubular reactor wall in opposition to the substrate, wherein the flow rate per unit area of a forcing gas which is supplied from the forcing gas introduction portion into the tubular reactor is made lower in the central portion of the forcing gas introduction portion than in the peripheral portion of the forcing gas introduction portion.

In addition, the present invention pertains to a chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate, a reaction gas exhaust portion, and a forcing gas introduction portion on a tubular reactor wall in opposition to the substrate, wherein the flow rate per unit area of a forcing gas which is supplied from the forcing gas introduction portion into the tubular reactor is made lower in the middle of a feed gas passageway than at both the end portions of said passageway.

Further, the present invention is concerned with a chemical vapor deposition method which comprises mounting a substrate on a susceptor for a horizontal tubular reactor, heating the substrate with a heater, supplying a gas containing a feed gas in the direction substantially parallel to the substrate, supplying a forcing gas from a forcing gas introduction portion placed on a tubular reactor wall in opposition to the substrate so as to subject a semiconductor film to chemical vapor deposition on said substrate, and which further comprises making the flow rate per unit area of the forcing gas that is supplied from the forcing gas introduction portion into the tubular reactor lower in the central portion of the forcing gas introduction portion than in the peripheral portion of the forcing gas introduction portion.

Furthermore, the present invention is related to a chemical vapor deposition method which comprises mounting a substrate on a susceptor for a horizontal tubular reactor, heating the substrate with a heater, supplying a gas containing a feed gas in the direction substantially parallel to the substrate, supplying a forcing gas from a forcing gas introduction portion placed on a tubular reactor wall in opposition to the substrate so as to subject a semiconductor film to chemical vapor deposition on said substrate, and which further comprises making the flow rate per unit area of the forcing gas that is supplied from the forcing gas introduction portion into the tubular reactor lower in the middle of a feed gas passageway than at both the end portions of said passageway.

In FIG. 1 to FIG. 5, the symbols shall have the following designations:

1: horizontal tubular reactor,
2: substrate,
3: susceptor
4: heater,
5: feed gas introduction portion,
6: reaction gas exhaust portion,
7: forcing gas introduction portion,
8: multi-micropore,
9$a$: dense multi-micropore portion,
9$b$: sparse multi-micropore portion,
9$c$: multi-micropore portion having larger pore diameter,
9$d$: multi-micropore portion having smaller pore diameter,
9$e$: multi-micropore portion,
10: central portion of forcing gas introduction portion,
11: peripheral portion of forcing gas introduction portion,
12: middle of feed gas passageway,
13: end portions of feed gas passageway,
14: feed gas passageway,
15: partition plate,
16: forcing gas passageway.

DESCRIPTION OF THE PREFERRED EMBODIMENTS

The apparatus and method for chemical vapor deposition according to the present invention are each applied to chemical vapor deposition using a horizontal tubular reactor where a gas containing a feed gas is supplied in the direction parallel to the substrate, and a forcing gas is supplied in the direction perpendicular to the substrate.

The chemical vapor deposition apparatus according to the present invention is such a chemical vapor deposition apparatus in which the flow rate per unit area of the forcing gas that is supplied from the forcing gas introduction portion into the tubular reactor is made lower in the central portion of the forcing gas introduction portion than in the peripheral portion of said portion; or the flow rate per unit area of the forcing gas that is supplied from the forcing gas introduction portion into the tubular reactor is made lower in the middle of a feed gas passageway than at both the end portions of said passage.

The chemical vapor deposition method according to the present invention is such a chemical vapor deposition method for conducting chemical vapor deposition in which the flow rate per unit area of the forcing gas that is supplied from the forcing gas introduction portion into the tubular reactor is made lower in the central portion of the forcing gas introduction portion than in the peripheral portion of said portion; or the flow rate per unit area of the forcing gas that is supplied from the forcing gas introduction portion into the tubular reactor is made lower in the middle of a feed gas passageway than at both the end portions of said passageway.

In regard to the apparatus and method for chemical vapor deposition according to the present invention, there is not any limitation on any of the kind, size and the number of substrate, and the kind and flow rate of the feed gas.

However, the apparatus and method for chemical vapor deposition according to the present invention are characterized by their capability of sufficiently exhibiting the working effects thereof in that a feed gas can be supplied at a uniform concentration over a wide range of a substrate, particularly in the case of conducting the chemical vapor deposition of a large-sized substrate having a diameter of at least 4 inches (101.6 mm, approx.) or simultaneously conducting that of 6 numbers of substrates. The kinds of the substrate are exemplified by sapphire, SiC, bulk gallium nitride, etc.

In addition, the apparatus and method for chemical vapor deposition according to the present invention are characterized by their capability of sufficiently exhibiting the working effects thereof in that in the case of performing chemical vapor deposition requiring a substrate heating temperature of 1000° C. or higher depending upon the kind of a feed gas, intricate gas stream on the substrate can easily be controlled. The chemical vapor deposition using such a feed gas is exemplified by chemical vapor deposition which is for a gallium nitride based compound semiconductor and in which use is made of trimethylgallium, triethylgallium, trimethylindium, triethylindium, trimethylaluminum or triethylaluminum as a source of group III metal, and of ammonia, monomethylhydrazine, dimethylhydrazine, tert-butylhydrazine or trimethylamine as a nitrogen source. By "gas containing a feed gas" as mentioned herein is meant a gas which is supplied by being diluted with a gas such as hydrogen, helium, argon, nitrogen or the like.

In what follows, detailed description will be given of the chemical vapor deposition apparatus according to the present invention with reference to FIG. 1 to FIG. 5, which however shall never limit the present invention thereto.

Figure 1:
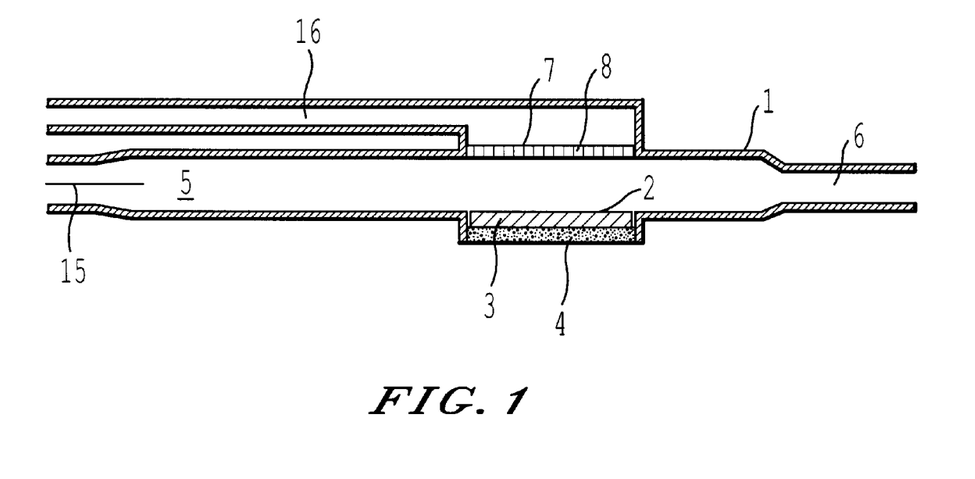
FIG. 1 is a vertical cross-sectional view showing one example of a chemical vapor deposition apparatus composed of a horizontal tubular reactor according to the present invention.
Figure 2A:
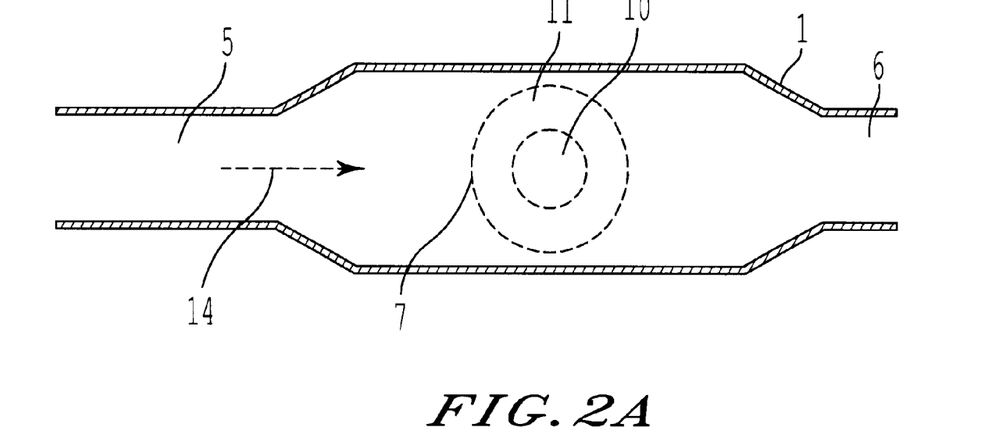
FIGS. 2A–2B are horizontal cross-sectional views showing one example of a chemical vapor deposition apparatus composed of a horizontal tubular reactor according to the present invention.
Figure 2B:
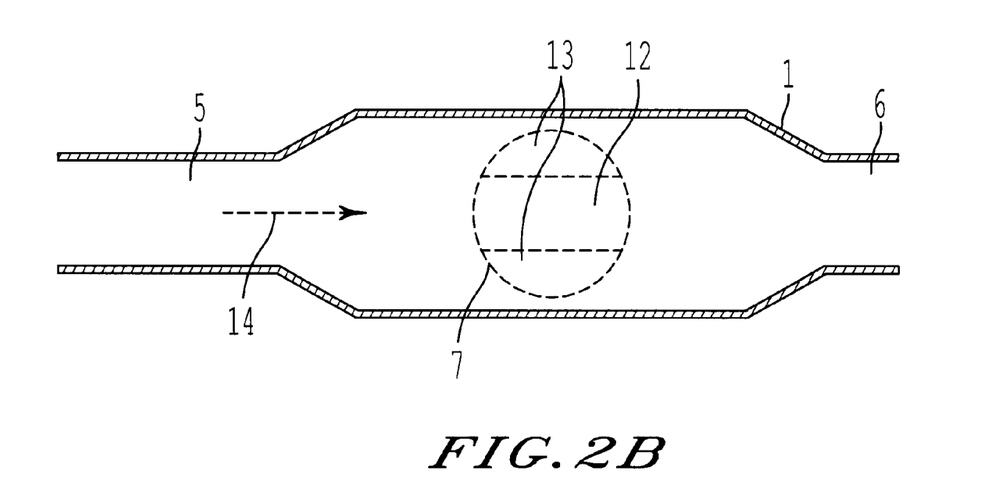

FIG. 1 is a vertical cross-sectional view showing one example of a chemical vapor deposition apparatus composed of a horizontal tubular reactor according to the present invention; and FIG. 2 is a horizontal cross-sectional view thereof. In FIG. 1 and FIG. 2, a horizontal tubular reactor 1 is equipped with a substrate 2, a susceptor 3 for holding and rotating the substrate, a heater 4 for heating the substrate, a feed gas introduction portion 5 arranged so that the direction of a feed gas supplied into the tubular reactor becomes substantially parallel to the substrate, a reaction gas exhaust portion 6 and a forcing gas introduction portion 7 on the horizontal tubular reactor wall in opposition to the substrate.

In regard to the chemical vapor deposition apparatus in FIG. 1 and FIG. 2, in the case where chemical vapor deposition of a semiconductor film is performed, there is supplied into the tubular reactor, a forcing gas composed of an inert gas or the like free from adverse influence upon the reaction of chemical vapor deposition through multi-micropores 8 in the forcing gas introduction portion. In the foregoing manner, the apparatus is of such constitution as enabling the forcing gas to form a thin gas layer on the reactor wall in opposition to the substrate and at the same time, to prevent decomposed products or reaction products from being deposited in the vicinity of the reactor wall in opposition to the substrate. The spacing between the substrate and the reactor wall in opposition to the substrate is usually 20 mm or smaller, preferably 10 mm or smaller, more preferably 5 mm or smaller.

The chemical vapor deposition apparatus according to the present invention is such an apparatus that is composed of the horizontal tubular reactor in which the flow rate per unit area of the forcing gas that is supplied from the forcing gas introduction portion 7 into the tubular reactor is lower in the central portion 10 of the forcing gas introduction portion than in the peripheral portion 11 of said portion as pointed out on FIG. 2(A); or the foregoing flow rate is lower in the middle 12 of a feed gas passageway 14 than at both the end portions 13 of said passage as pointed out on FIG. 2(B). In the apparatus according to the present invention, the flow rate of the forcing gas which is supplied from the forcing gas introduction portion into the tubular reactor is controlled usually with sparseness/density, size, arrangement or the combination thereof of multi-micropores 8 that are provided in the forcing gas introduction portion, or can be controlled with a plurality of pipelines.

The present invention, wherein the flow rate per unit area of the forcing gas which is made lower in the central portion of the forcing gas introduction portion than in the peripheral portion of said portion, includes the case where the flow rate is increased stepwise from the central portion towards the peripheral portion and also the case where the flow rate is increased continuously therefrom.

FIG. 3 is a plan view showing one example of a forcing gas introduction portion in which the flow rate of the forcing gas is made lower in the central portion of a forcing gas introduction portion than in the peripheral portion of said portion, the flow rate being controlled with sparseness/density, size, arrangement and the like of multi-micropores 8 in FIG. 1. FIG. 4 is a plan view showing one example of a forcing gas introduction portion in which the flow rate of the forcing gas is made lower in the middle of a feed gas passageway than at both the end portions of said passageway, the flow rate being controlled with sparseness/density, size, arrangement and the like of multi-micropores 8 in FIG. 1. FIG. 5 is a plan view showing one example of a forcing gas introduction portion in which the flow rate of the forcing gas satisfies both the requirements in FIG. 3 and FIG. 4. In FIGS. 4 and 5, the flow direction of the feed gas is left to right, and vice versa.

Regarding the forcing gas introduction portion in FIGS. 3 to 5, the flow rate of the forcing gas is made lower in the central portion of the forcing gas introduction portion than in the peripheral portion of said portion, or made lower in the middle of a feed gas passageway than at both the end portions of said passageway, the flow rate being controlled by regulating sparseness/density of the multi-micropores in FIGS. (A) and (D); regulating the size of the multi-micropores in (B); and regulating the arrangement thereof in (C). As illustrated in FIG. 3 to FIG. 5, the forcing gas introduction portion in the present invention, which is usually circular, is not specifically limited thereto. The distribution configuration of the multi-micropores, which is usually circular, ellipsoidal or band-like, is not specifically limited thereto. The multi-micropores on the forcing gas introduction portion can be constituted of the group of a large number of straight pipes, but is preferably of a sintered compact such as quartz glass in view of its capability of forming a thin gas layer. The size of pores made in the quartz glass sintered compact is not specifically limited, but is in the range of usually 0.1 to 3 mm, approximately, preferably 0.3 to 2 mm, approximately, since coarse pores bring about a fear of failure to uniformly pass a gas through the multi-micropores, whereas unreasonably fine pores leads to a large pressure loss, thereby failing to assure an expected gas flow rate.

The position at which the multi-micropore portion is placed on the tubular reactor wall in opposition to the substrate in the chemical vapor deposition apparatus according to the present invention is located usually on the face in opposition to the substrate and on somewhat upstream side of a feed gas passage or in the vicinity thereof. By extending the multi-micropore portion to the downstream side of the substrate, it is made possible to prevent the tubular reactor from being contaminated on the downstream side thereof. The size of the multi-micropore portion, which may almost correspond to that of the substrate, varies depending upon the shape of the tubular reactor, flow rate of a gas containing a feed gas and the like, and thus can not be unequivocally specified. The size thereof is usually 0.5 to 5 times, preferably 1.0 to 3.5 times approximately that of the substrate face, which means the area encompassed by the outermost locus which is depicted by the end face of the the substrate during the chemical vapor deposition operation. Accordingly, the substrate face is almost the same as the area encompassed by the locus of the outside diameter of a susceptor.

In the following, detailed description will be given of the chemical vapor deposition method according to the present invention.

The chemical vapor deposition method according to the present invention is a method for subjecting the substrate to chemical vapor deposition to form a semiconductor film thereon by the use of the above-mentioned chemical vapor deposition apparatus, wherein the flow rate per unit area of the forcing gas that is supplied from the forcing gas introduction portion into the tubular reactor is made lower in the central portion of the forcing gas introduction portion than in the peripheral portion of said portion; or the flow rate per unit area of the forcing gas that is supplied from the forcing gas introduction portion into the tubular reactor is made lower in the middle of a feed gas passageway than at both the end portions of said passageway.

The flow rate of the forcing gas supplied from the forcing gas introduction portion, which needs only to form a thin gas layer, is usually approximately 1/30 to 1/3, preferably 1/10 to 1/4 that of the gas containing the feed gas expressed in terms of a flow rate per multi-micropores portion having a same size as that of the substrate face. The flow rate of the forcing gas, when being less than 1/30 that of the gas containing the feed gas, leads to failure to form a thin gas layer, thereby making it impossible to exhibit the effect on preventing decomposed products or reaction products from being deposited, whereas said flow rate, when being more than 1/3 that thereof, brings about a fear of disturbing the stream of the gas on the substrate.

Regarding the chemical vapor deposition method according to the present invention, in the case where the flow rate per unit area of the forcing gas that is supplied from the forcing gas introduction portion into the tubular reactor is made lower in the central portion of the forcing gas introduction portion than in the peripheral portion of said portion, the flow rate per unit area of the forcing gas in the central portion thereof is usually 90% or less, preferably 50% or less of the flow rate in the peripheral portion of said portion; and also in the case where the flow rate per unit area of the forcing gas is made lower in the middle of a feed gas passageway than at both the end portions of said passageway, the flow rate per unit area of the forcing gas in the middle of a feed gas passage is usually 90% or less, preferably 50% or less of the flow rate at both the end portions of said passage.

The forcing gas to be used in the present invention is not specifically limited provided that the chemical vapor deposition reaction is not affected thereby, but may be selected for use from among hydrogen and nitrogen as well as an inert gas such as helium and argon.

The temperature and pressure at which the chemical vapor deposition method according to the present invention is carried out are not specifically limited. It is also possible however, to operate at a temperature in the range of 600 to 1400° C., and at atmospheric pressure, at reduced pressure to under pressure such as 0.1 $MPa/cm^2G$.

In summarizing the working effects and advantages of the present invention, the apparatus and method for chemical vapor deposition as described hereinabove have enabled to assure high quality crystal without generating any deposit of decomposed products or reaction products on the tubular reactor wall in opposition to the substrate even in the case of carrying out chemical vapor deposition of a large-sized substrate or simultaneously conducting that of a plurality of substrates, or performing the same at a high temperature.

In what follows, the present invention will be described in more detail with reference to comparative examples and working examples, which however shall never limit the invention thereto.

EXAMPLE 1

Preparation of Chemical Vapor Deposition Apparatus

A chemical vapor deposition apparatus was prepared which had the constitution same as that shown in the vertical cross-sectional view on FIG. 1 and the horizontal cross-sectional view on FIG. 2, and which was composed of a quartz made horizontal tubular reactor having an inside width of 280 mm at a forcing gas introduction portion, an inside height of 20 mm and an inside length of 1500 mm. A susceptor and a heater each in circular form had an outside diameter of 260 mm. One substrate having a diameter of 2 inches(50.8 mm, approximately) was placed in the central portion of the susceptor, and five substrates making a total of six numbers were each placed at a same spacing in the peripheral portion of the susceptor so as to enable to simultaneously process the substrates.

Figure 3A:
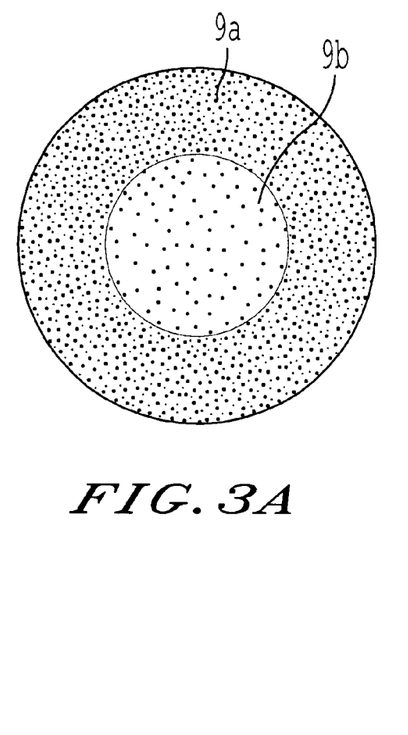
FIGS. 3A–3D are plan views showing examples of a forcing gas introduction portion (such constitution that the flow rate of the forcing gas is made lower in the central portion of a forcing gas introduction portion than in the peripheral portion of the forcing gas introduction portion) of a chemical vapor deposition apparatus according to the present invention.

In addition, a forcing gas introduction portion as illustrated in FIG. 3(A) was prepared which was made of a sintered compact of quartz glass and which had a multi-micropore portion having sparse micropores in the central portion with an outside diameter of 100 mm, and having dense micropores in the peripheral portion with an outside diameter of 260 mm, wherein the micropore density ratio of the sparse multi-micropore portion to the dense multi-micropore portion was 1:3, and the area of the multi-micropore portion in the forcing gas introduction portion was 2.5 times the area of the substrate face.

Experiment on Chemical Vapor Deposition

By the use of the chemical vapor deposition apparatus thus prepared, crystal growth of GaN was effected on the sapphire substrates each having a diameter of 2 inches (50.8 mm. approx.) in the following manner.

The sapphire substrates were each fixed to the susceptor, the atmosphere in the reactor was replaced with hydrogen gas, then hydrogen at a flow rate of 65 l/min was supplied through a first passageway of a feed gas introduction portion (the passageway beneath the partition plate 15 in FIG. 1), and hydrogen at a flow rate of 20 l/min was supplied through the multi-micropore portion in the forcing gas introduction portion, while heating the substrates to 1150° C. to carry out a heat treatment of the substrates for 10 minutes.

Subsequently, the reaction temperature of the substrates was lowered to 500° C., and the substrates were allowed to stand until it was stabilized. Then, a mixed gas of ammonia and hydrogen (40 l/min of ammonia and 10 l/min of hydrogen) was supplied through a first passageway of the feed gas introduction portion, hydrogen gas containing trimethylgallium (240 μmol/min of trimethylgallium and 50 l/min of hydrogen) was supplied through a second passageway of the feed gas introduction portion (the passageway above the partition plate 15 in FIG. 1) and at the same time, 50 l/min of nitrogen was supplied through the multi-micropore portion to carry out chemical vapor deposition of GaN at a low temperature for 5 minutes.

After the formation of a growth layer at a low temperature, the supply of trimethylgallium was ceased, the temperature was raised to 1100° C., and the layer was allowed to stand until it was stabilized. Next, hydrogen gas containing trimethylgallium (240 μmol/min of trimethylgallium and 50 l/min of hydrogen) was again supplied through the second passageway of the feed gas introduction portion and at the same time, 50 l/min of nitrogen was supplied through the multi-micropore portion to carry out chemical vapor deposition of GaN for 60 minutes during which time the susceptor and the substrates were rotated at 12 r.p.m. and 36 r.p.m., respectively. In this manner, the chemical vapor deposition was carried out 5 times repeatedly.

Evaluation of GaN Film, Etc.

After the completion of the chemical vapor deposition, the tubular reactor wall in opposition to the substrates was checked for the existence of solid adhesion. As a result, no solid adhesion was observed. Thereafter, the substrates were taken out, and a measurement was made of film thickness distribution from the center of each of the substrates towards the periphery thereof, taking into consideration rotation of the substrates during the chemical vapor deposition to evaluate the uniformity of the film thickness. In Table 1 are given the results of the measurements of the film thickness and variation range thereof {(maximum-minimum)/average} for the one substrate placed in the central portion of the susceptor and also five substrates placed in the peripheral portion thereof. Further, in order to evaluate the crystal quality and electrical characteristics of the deposited film, measurements were made of X-ray diffraction {half-value width of (002) face} and hole (mobility) for the six substrates. The results are also given in Table 1, in which the value for the substrates in the peripheral portion indicates the average of five values, and the same applies to each of the following examples.

EXAMPLE 2

Figure 3B:
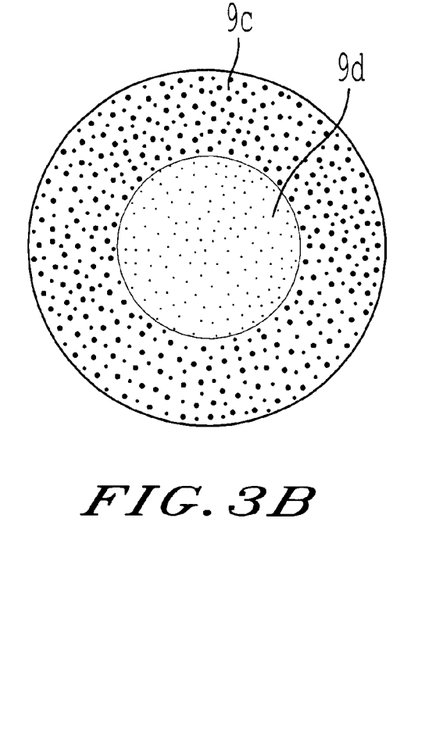

A chemical vapor deposition apparatus was prepared in the same manner as in Example 1, except that a forcing gas introduction portion as illustrated in FIG. 3(B) was prepared which was made of a sintered compact of quartz glass and which had a multi-micropore portion having small diameter micropores in the central portion with an outside diameter of 100 mm, and having large diameter micropores in the peripheral portion with an outside diameter of 260 mm, wherein the ratio of the small diameter to the large diameter was 1:2. Subsequently, experiment on chemical vapor deposition and evaluation of GaN film, etc. were put into practice in the same manner as in Example 1, except that use was made of the chemical vapor deposition apparatus just described. The results are also given in Table 1.

EXAMPLE 3

Figure 3C:
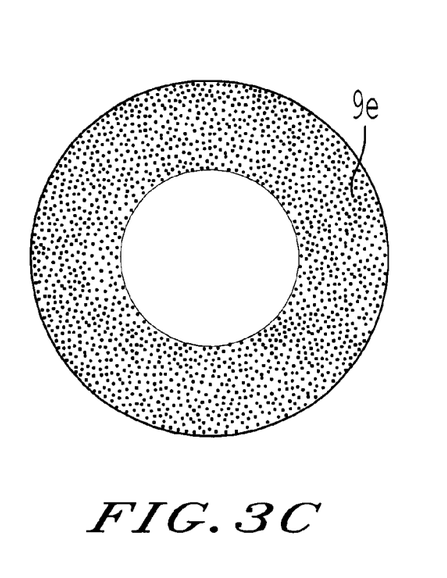
Figure 3D:
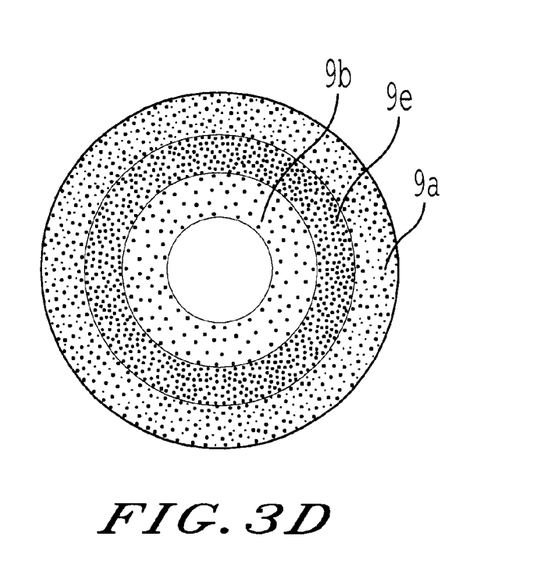

A chemical vapor deposition apparatus was prepared in the same manner as in Example 1, except that a forcing gas introduction portion as illustrated in FIG. 3(C) was prepared which was made of a sintered compact of quartz glass and which had a portion being free from multi-micropore in the central portion with an outside diameter of 100 mm, and a multi-micropore portion in the peripheral portion with an outside diameter of 260 mm. Subsequently, experiment on chemical vapor deposition and evaluation of GaN film, etc. were put into practice in the same manner as in Example 1, except that use was made of the chemical vapor deposition apparatus just described. The results are also given in Table 1.

EXAMPLE 4

Figure 4A:
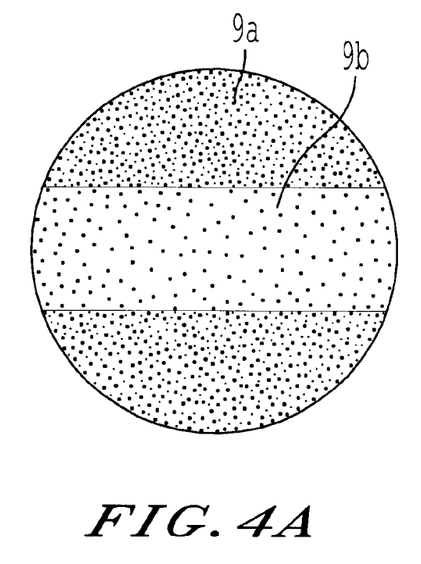
FIGS. 4A–4D are plan views showing examples of a forcing gas introduction portion (such constitution that the flow rate of the forcing gas is made lower in the middle of a feed gas passageway than at both the end portions of said passageway) of a chemical vapor deposition apparatus according to the present invention.

A chemical vapor deposition apparatus was prepared in the same manner as in Example 1, except that a forcing gas introduction portion as illustrated in FIG. 4(A) was prepared which was made of a sintered compact of quartz glass and which had a multi-micropore portion having sparse multi-micropores in the central portion with a width of 60 mm in the feed gas passageway and having dense multi-micropores at both the end portions with an outside diameter of 260 mm in the same. Subsequently, experiment on chemical vapor deposition and evaluation of GaN film, etc. were put into practice in the same manner as in Example 1, except that use was made of the chemical vapor deposition apparatus just described. The results are also given in Table 1.

EXAMPLE 5

Figure 4B:
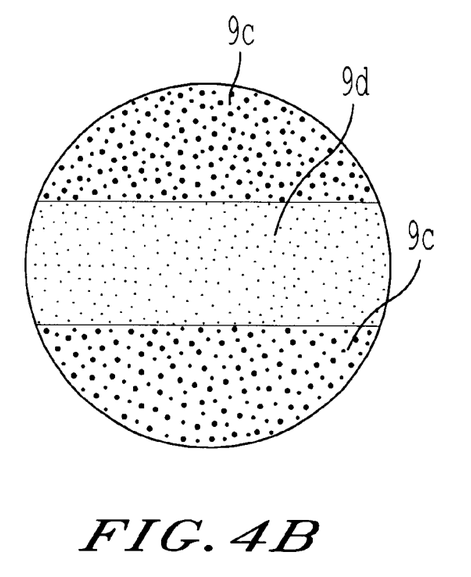

A chemical vapor deposition apparatus was prepared in the same manner as in Example 1, except that a forcing gas introduction portion as illustrated in FIG. 4(B) was prepared which was made of a sintered compact of quartz glass and which had a multi-micropore portion having small diameter micropores in the central portion with a width of 60 mm in the feed gas passageway and having large diameter micropores at both the end portions with an outside diameter of 260 mm in the same. Subsequently, experiment on chemical vapor deposition and evaluation of GaN film, etc. were put into practice in the same manner as in Example 1, except that use was made of the chemical vapor deposition apparatus just described. The results are also given in Table 1.

EXAMPLE 6

Figure 4C:
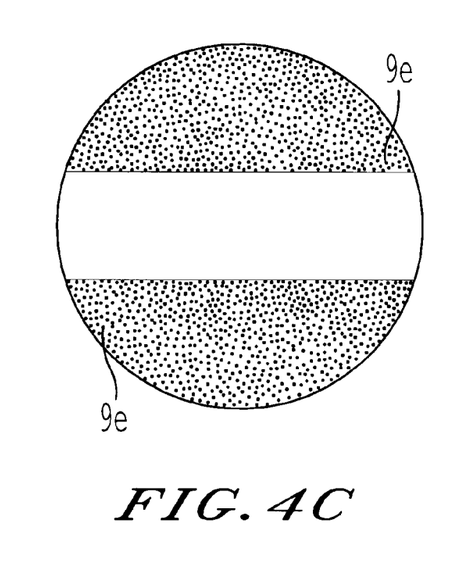
Figure 4D:
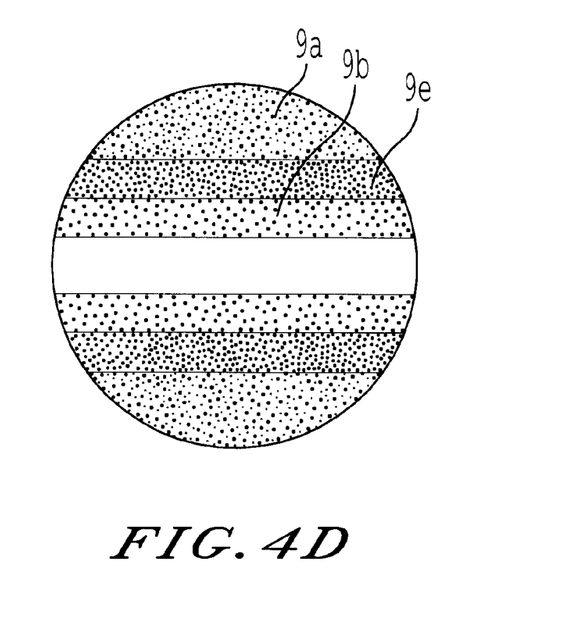
Figure 5A:
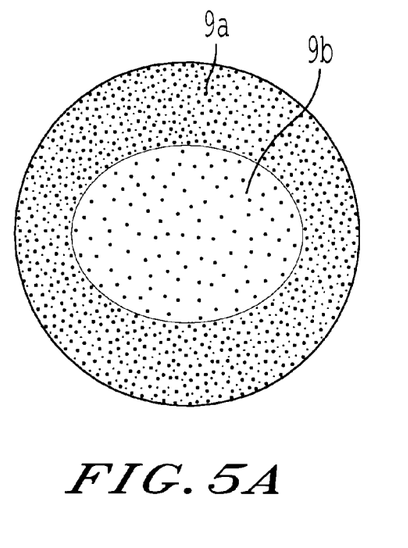
FIGS. 5A–5D are plan views showing examples of a forcing gas introduction portion (other than the cases of FIGS. 3 & 4).
Figure 5B:
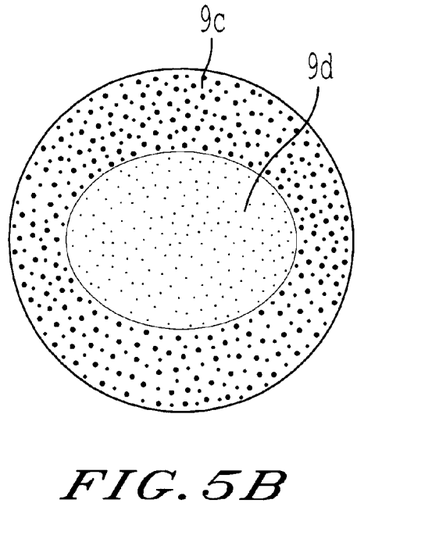
Figure 5C:
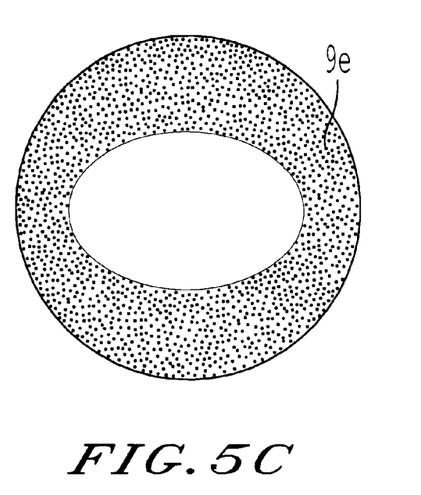
Figure 5D:
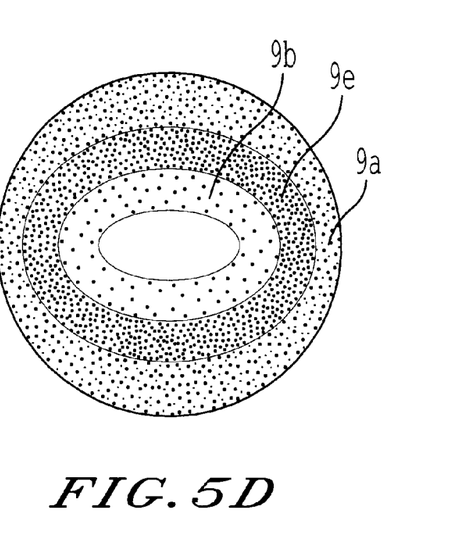

A chemical vapor deposition apparatus was prepared in the same manner as in Example 1, except that a forcing gas introduction portion as illustrated in FIG. 4(C) was prepared which was made of a sintered compact of quartz glass and which had a portion being free from multi-micropore in the central portion with a width of 60 mm in the feed gas passageway, and having a multi-micropore portion at both the end portions with an outside diameter of 260 mm in the same. Subsequently, experiment on chemical vapor deposition and evaluation of GaN film, etc. were put into practice in the same manner as in Example 1, except that use was made of the chemical vapor deposition apparatus just described. The results are also given in Table 1.

COMPARATIVE (COMP.) EXAMPLE 1

A chemical vapor deposition apparatus was prepared in the same manner as in Example 1, except that a forcing gas introduction portion was prepared which was made of a sintered compact of quartz glass and which had a totally uniform multi-micropore portion with an outside diameter of 260 mm. Subsequently, experiment on chemical vapor deposition and evaluation of GaN film, etc. were put into practice in the same manner as in Example 1, except that use was made of the chemical vapor deposition apparatus just described. The results are also given in Table 1.

TABLE 1

|  | Forcing gas-introduction portion | Substrate position | Film thickness ($\mu$m) | Variation range (%) | Harfvalue width (arcsec) | Mobility ($cm^2$/vs) | Solid adhesion) |
|---|---|---|---|---|---|---|---|
| Example 1 | Fig. 3(A) | central | 2.48 | 2 | 232 | 193.5 | none |
|  |  | periph'l | 2.43 | 2 | 240 | 178.3 |  |
| Example 2 | Fig. 3(B) | central | 1.74 | 3 | 242 | 166.8 | none |
|  |  | periph'l | 1.78 | 3 | 273 | 136.1 |  |
| Example 3 | Fig. 3(C) | central | 1.72 | 3 | 267 | 141.3 | none |
|  |  | periph'l | 1.78 | 3 | 312 | 134.1 |  |
| Example 4 | Fig. 4(A) | central | 2.76 | 2 | 368 | 231.6 | none |
|  |  | periph'l | 2.72 | 2 | 320 | 230.4 |  |
| Example 5 | Fig. 4(B) | central | 2.61 | 3 | 220 | 218.0 | none |
|  |  | periph'l | 2.56 | 2 | 241 | 220.6 |  |
| Example 6 | Fig. 4(C) | central | 1.62 | 3 | 284 | 144.2 | none |
|  |  | periph'l | 1.58 | 3 | 362 | 140.1 |  |
| Comp. Example 1 | uniform multi-micropore | central | 1.54 | 4 | 378 | 128.1 | none |
|  |  | periph'l | 1.47 | 5 | 446 | 122.2 |  |

[Remarks] central: central portion, periph'l: peripheral portion

It has been recognized from the foregoing results that the apparatus and method for chemical vapor deposition according to the present invention are capable of assuring GaN films excellent in electrical characteristics and uniformity in chemical vapor deposition which is for GaN films and which necessitates a temperature of 1000° C. or higher without being affected by the position whether it is a central position or a peripheral position.

What is claimed is:

1. A chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate, a reaction gas exhaust portion, and a forcing gas introduction portion on a tubular reactor wall in opposition to the substrate, wherein the flow rate per unit area of a forcing gas which is supplied from the forcing gas introduction portion into the tubular reactor is made lower in the central portion of the forcing gas introduction portion than in the peripheral portion of the forcing gas introduction portion.

2. The chemical vapor deposition apparatus according to claim 1, wherein the forcing gas introduction portion comprises a multi-micropore portion having sparse micropores in the central portion and dense micropores in the peripheral portion.

3. The chemical vapor deposition apparatus according to claim 1, wherein the forcing gas introduction portion comprises a multi-micropore portion having a small pore diameter in the central portion and a large pore diameter in the peripheral portion.

4. The chemical vapor deposition apparatus according to claim 1, wherein the forcing gas introduction portion comprises a multi-micropore portion only in the peripheral portion.

5. The chemical vapor deposition apparatus according to claim 1, wherein the susceptor is of such constitution that a plurality of substrates are mounted thereon.

6. The chemical vapor deposition apparatus according to claim 1, wherein the susceptor is of such constitution that a large-sized substrate having a size of 4 inches (101.6 mm, approx.) or larger is mounted thereon.

7. A chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate, a reaction gas exhaust portion, and a forcing gas introduction portion on a tubular reactor wall in opposition to the substrate, wherein the flow rate per unit area of a forcing gas which is supplied from the forcing gas introduction portion into the tubular reactor is made lower in the middle of a feed gas passageway than at both the end portions of said passageway.

8. The chemical vapor deposition apparatus according to claim 7, wherein the forcing gas introduction portion comprises a multi-micropore portion having sparse micropores in the middle of a feed gas passageway and dense micropores at both the end portions of said passageway.

9. The chemical vapor deposition apparatus according to claim 7, wherein the forcing gas introduction portion comprises a multi-micropore portion having a small pore diameter in the central portion of a feed gas passageway and a large pore diameter at both the end portions of said passageway.

10. The chemical vapor deposition apparatus according to claim 7, wherein the forcing gas introduction portion comprises a multi-micropore portion only at both the end portions of a feed gas passageway.

11. The chemical vapor deposition apparatus according to claim 7, wherein the susceptor is of such constitution that a plurality of substrates are mounted thereon.

12. The chemical vapor deposition apparatus according to claim 7, wherein the susceptor is of such constitution that a large-sized substrate having a size of 4 inches (101.6 mm, approx.) or larger is mounted thereon.

* * * * *